United States Patent [19]
May et al.

[11] Patent Number: 5,943,585
[45] Date of Patent: Aug. 24, 1999

[54] TRENCH ISOLATION STRUCTURE HAVING LOW K DIELECTRIC SPACERS ARRANGED UPON AN OXIDE LINER INCORPORATED WITH NITROGEN

[75] Inventors: Charles E. May, Austin; Mark I. Gardner, Cedar Creek; H. Jim Fulford, Jr., Austin, all of Tex.

[73] Assignee: Advanced Micro Devices, Inc.

[21] Appl. No.: 08/994,253

[22] Filed: Dec. 19, 1997

[51] Int. Cl.[6] .................................................. H01L 21/76
[52] U.S. Cl. ........................................... 438/400; 438/424
[58] Field of Search ..................................... 438/424, 400

[56] References Cited

U.S. PATENT DOCUMENTS 5,472,894  12/1995  Hsu et al. .
5,702,976  12/1997  Schuegraf et al. .
5,811,347   9/1998  Gardner et al. .

Primary Examiner—John F. Niebling
Assistant Examiner—Josetta Jones
Attorney, Agent, or Firm—Kevin L. Daffer; Conley, Rose & Tayon

[57] ABSTRACT

A process is provided for forming a trench isolation structure which includes dielectric spacers composed of a dielectric material having a relatively low dielectric constant, K, that is approximately less than 3.8. The capacitance between active areas separated by the trench isolation structure, being directly proportional to K, is thus reduced. In an embodiment, a trench is etched within a semiconductor substrate upon which a masking layer is formed. An oxide liner which is incorporated with nitrogen atoms is thermally grown upon the sidewalls and base of the trench. A layer of low K dielectric material is deposited across the oxide liner and the masking layer. The dielectric material is anisotropically etched to form sidewall spacers upon the oxide liner. A fill oxide is then formed within the trench upon the sidewall spacers and the oxide liner. The resulting trench isolation structure includes a low K dielectric material interposed between an oxide liner and a fill oxide. The trench isolation structure is less is likely to experience current leakage during the operation of an ensuing integrated circuit employing the isolation structure.

12 Claims, 4 Drawing Sheets

«5,943,585»

TRENCH ISOLATION STRUCTURE HAVING LOW K DIELECTRIC SPACERS ARRANGED UPON AN OXIDE LINER INCORPORATED WITH NITROGEN

BACKGROUND OF THE INVENTION

1. Field of the Invention

This invention relates to integrated circuit fabrication and, more particularly, to a trench isolation structure which includes dielectric sidewall spacers having a relatively low dielectric constant arranged upon an oxide liner incorporated with nitrogen.

2. Description of the Relevant Art

The fabrication of an integrated circuit involves forming numerous devices in active areas of a semiconductor substrate. Select devices are interconnected by conductors which extend over a dielectric that separates or "isolates" those devices. Implementing an electrical path across a monolithic integrated circuit involves selectively connecting devices which are isolated from each other. When fabricating integrated circuits, it is therefore necessary to isolate devices built into the substrate from one another. From this perspective, isolation technology is one of the critical aspects of fabricating a functional integrated circuit.

A popular isolation technology used for a MOS integrated circuit is a technique known as the "shallow trench process". Conventional trench processes involve the steps of etching a silicon-based substrate surface to a relatively shallow depth, e.g., between 0.2 to 0.5 microns, and then refilling the shallow trench with a deposited dielectric. The trench dielectric is then planarized to complete formation of a trench isolation structure in field regions of the substrate. The trench isolation structure is formed during the initial stages of integrated circuit fabrication, before source and drain implants are placed in active areas of the substrate which are interposed between the field regions. Trench isolation processing serves to prevent the establishment of parasitic channels in the field regions between active areas. The trench process is becoming more popular than the local oxidation of silicon ("LOCOS") process, another well known isolation technique. The shallow trench process eliminates many of the problems associated with LOCOS, such as bird's-beak and channel-stop dopant redistribution problems. In addition, the trench isolation structure is fully recessed, offering at least a potential for a planar surface. Yet further, field-oxide thinning in narrow isolation spaces is less likely to occur when using the shallow trench process.

While the conventional trench isolation process has many advantages over LOCOS, the trench process also has several problems. Because of an increased desire to build faster and more complex integrated circuits, the semiconductor industry has devoted much effort to reducing the feature sizes of and the separation between active devices arranged within a semiconductor substrate. Consequently, the lateral width of the trench isolation structure has grown increasingly smaller. To ensure that a trench isolation structure can effectively isolate active devices, the capacitance between those active devices must be minimized. The value of this capacitance is dependent upon the lateral width of the isolation structure and the relative permittivity of the trench dielectric, which is typically silicon dioxide ("oxide"). Permittivity, $\epsilon$, of a material reflects the ability of the material to be polarized by an electric field. The capacitance between two active areas separated by a dielectric is directly proportional to the permittivity of the dielectric. The permittivity of a material is typically described as its permittivity normalized to the permittivity of a vacuum, $\epsilon_o$. Hence, the relative permittivity or dielectric constant of a material is defined as:

$K=\epsilon/\epsilon_o$.

The capacitance between active areas laterally spaced apart by a dielectric increases as the lateral width of the dielectric decreases. Unfortunately, the dielectric constant, K, of oxide is not sufficiently low (i.e., K is approximately 3.7 to 3.8) to counterbalance the effect that reducing the lateral width of the isolation structure has on the capacitance between active areas. As such, the breakdown voltage of the trench isolation structure decreases as the lateral width of the isolation structure is reduced. As a result, current may inadvertently flow between active devices separated by a narrowed trench isolation structure. In particular, current leakage between a source/drain region of one transistor and a source/drain region of another transistor may occur. In this manner, a transistor may receive a false signal, resulting in improper operation or failure of an integrated circuit employing the trench isolation structure.

Since trench formation involves etching the silicon substrate, it is believed that dangling bonds and an irregular grain structure form in the silicon substrate near the walls of the trench. In a subsequent processing step, the active areas of the semiconductor substrate may be implanted with impurity species to form source/drain regions therein. The semiconductor topography may be subjected to a high temperature anneal to activate the impurity species in the active areas and to annihilate crystalline defect damage of the substrate. Unfortunately, impurity species which have a relatively high diffusivity, such as boron, may undergo diffusion into the isolation region when subjected to high temperatures. The irregular grain structure may provide migration avenues through which the impurity species can pass from the active areas to the trench isolation structures. Moreover, the dangling bonds may provide opportune bond sites for diffusing impurity species, thereby promoting accumulation of impurity species near the edges of the isolation structures.

It is postulated that the presence of foreign atoms within a trench isolation structure may result in that structure having a relatively high defect density. For example, clusters of foreign atoms may cause dislocations to form in close proximity to the lateral edges of the trench isolation structure. It is believed that the voltage required to cause dielectric breakdown of a trench isolation structure decreases as the defect density (or doping density) within the isolation structure increases. Consequently, when a voltage is applied to a source/drain region of a transistor arranged laterally adjacent the isolation structure, dielectric breakdown may occur in those areas of the isolation structure having a high defect and/or doping density. The threshold voltage near the lateral edges of the trench isolation structure may therefore be reduced, causing current leakage within the isolation structures.

It would therefore be desirable to develop a technique for forming a trench isolation structure which would be less likely to experience breakdown during operation of an integrated circuit employing the isolation structure. It would be beneficial if the dimensions of the trench isolation structure could be reduced without being concerned with current leakage between active areas isolated by the isolation structure. Increased capacitance between active areas separated by the isolation structure could thus be prevented, despite reductions in the lateral width of the isolation structure. Reducing the doping density within the trench isolation structure would also provide better protection against dielectric breakdown of the isolation structure. An increased integration density and reduced propagation delay of active devices separated by trench isolation structures could be accomplished without sacrificing operability of the integrated circuit.

SUMMARY OF THE INVENTION

The problems outlined above are in large part solved by the technique hereof for fabricating a trench isolation structure which includes an oxide liner incorporated with nitrogen and sidewall spacers composed of a dielectric material having a relatively low dielectric constant, K. That is, the dielectric constant of the dielectric material is approximately less than 3.8. The sidewall spacers are arranged upon the lateral surfaces of the oxide liner which is arranged at the periphery of a trench formed within a silicon-based substrate. The capacitance between active areas separated by the trench isolation structure, being directly proportional to K, is thus reduced by the presence of the sidewall spacers. Therefore, the lateral width of the isolation structure may be decreased without significantly increasing the capacitance between those active areas. As such, the lateral dimensions of trench isolation structures arranged within a unitary substrate may be minimized to permit increased circuit integration density while maintaining sufficient isolation of the active areas.

The oxide liner is formed by oxidizing the silicon-based surfaces of the substrate at the trench perimeter using a nitrogen- and oxygen-bearing ambient. As a result of the oxidation, barrier atoms, preferably nitrogen atoms, are positioned within the oxide liner in close proximity to the oxide liner/substrate interface. The nitrogen atoms thusly placed may "stuff" grain boundaries within the substrate, thereby blocking migration avenues into the ensuing trench isolation structure. Consequently, impurity species later implanted into regions (e.g., active areas) of the substrate laterally adjacent the oxide liner are inhibited from passing through the grain boundaries into the trench isolation structure. Moreover, the nitrogen atoms may terminate dangling bonds at the periphery of the trench. Relatively strong Si—N bonds that cannot be easily broken thus may be formed near the trench edges. In addition, the nitrogen atoms may fill interstitial positions and vacancies present within the substrate proximate the edges of the trench. Absent opportune bond sites and available interstitial and vacancy positions, impurity species are less likely to become embedded within the ensuing trench isolation structure. As a result of there being less impurity species arranged within the trench isolation structure, the dopant density and/or the defect density within the isolation structure is reduced. The presence of nitrogen atoms within the oxide liner arranged at the perimeter of the isolation trench as well as the configuration of low K dielectric spacers upon the oxide liner provides protection against breakdown of the trench isolation structure. Therefore, the voltage required to cause dielectric breakdown of the trench isolation structure is increased. In this manner, problems such as current (and thus a false signal) undesirably passing from a source/drain region of one transistor to a source/drain region of another transistor via the isolation structure are less likely to be encountered.

In one embodiment of the present invention, a masking layer comprising a nitride layer arranged upon a relatively thin oxide layer is formed across a semiconductor substrate. Select portions of the masking layer and underlying substrate not covered by a protective photoresist layer may then be removed to form a relatively shallow trench within the substrate. The masking layer remains disposed upon the upper surface of the substrate exclusive of the trench. Thereafter, the semiconductor topography may be subjected to thermal radiation while being immersed within an ambient which comprises oxygen- and nitrogen-containing molecules, e.g., NO or $N_2O$. In this manner, the exposed surfaces of the silicon-based substrate are oxidized to form an oxide liner incorporated within nitrogen at the perimeter of the trench. The masking layer prevents oxidation of the underlying upper surface of the substrate. Subsequently, a dielectric material having a relatively low K value of less than about 3.8 may be deposited using chemical vapor deposition ("CVD") across the oxide liner and exposed surfaces of the masking layer. The dielectric material may then be anisotropically etched to form sidewall spacers upon lateral surfaces of the oxide liner. Thereafter, fill oxide may be deposited within the trench and across the masking layer to a level spaced above the upper surface of the masking layer. A chemical-mechanical polishing ("CMP") step may then be used to planarize the upper surface of the fill oxide. The CMP step may be performed for the time period required to remove portions of the fill oxide and the masking layer down to a level slightly spaced above the peaks of the sidewall spacers. The masking layer is then etched away to expose the upper surface of the silicon-based substrate.

The resulting trench isolation structure comprises sidewall spacers composed of a low K dielectric material bounded within a shallow trench area and encapsulated on all sides by oxide. The oxide liner is strategically placed between the silicon-based substrate and the low K dielectric material of the sidewall spacers. The oxide liner advantageously serves as a diffusion barrier against cross-diffusion of atoms within the sidewall spacers and species within active areas of the silicon-based substrate. The low K dielectric material may include various fluorine-based compounds and/or polymers. Species within the dielectric material, such as fluorine (F), carbon (C), and hydrogen (H) atoms may have detrimental effects on active areas of the semiconductor substrate. Accordingly, preventing the diffusion of such species from the sidewall spacers to the active areas is necessary to ensure proper operation of the ensuing integrated circuit. Absent the presence of the oxide liner between the dielectric material and the substrate, the F, C, and H atoms within the sidewall spacers would be able to migrate into adjacent active areas. Since trench formation involves etching of the silicon substrate, it is believed that dangling bonds and an irregular grain structure exist in the silicon substrate near the walls of the trench. Therefore, during a subsequent anneal step, the irregular grain structure would provide migration avenues through which contaminating atoms could pass into the active areas. The dangling bonds would provide opportune bonds sites for the F, C, and H atoms, and Si—F, Si—C, and Si—H bonds might form within the active areas, particularly in close proximity to the trench walls. Thus, in later processing steps, fewer less segregation sites would be available to impurity species implanted within the active areas. As a result, the resistivity of ensuing source/drain regions formed within the active areas of the substrate might be increased from design specification, particularly near the edges of the isolation trench. The lateral edges of the ensuing transistors which would employ those source/drain regions might conduct less current than the interior portion of the transistors. Therefore, more charge to the gate of each transistor would be required to invert the underlying channel, resulting in an undesirable shift of the transistor threshold voltage, $V_T$, from its design specification.

In addition to preventing species within the low K dielectric material from migrating into the active areas, it is also necessary to inhibit the diffusion of impurity species from the substrate into the sidewall spacers. Typically, a channel-stop implant is forwarded into regions of the substrate arranged directly underneath the isolation trench prior to filling the trench with material. A $p^+$ implant of boron may, e.g., be used for the channel-stop implant. Absent the oxide liner between the substrate and the low K dielectric material, it would be possible for the implanted impurity species to pass through migration avenues at the trench walls and into the dielectric material. For example, boron atoms might diffuse into the dielectric material and bond with fluorine atoms to form a highly stable compound, e.g., boron difluoride. As a result, fewer less boron atoms would be available in the substrate to prevent flow of current underneath the trench isolation structure. Further, the presence of boron atoms and their associated compounds within the dielectric material might cause the resistivity of the dielectric material to decrease. Absent the oxide liner, impurity species implanted into the active areas of the substrate during later processing steps might also pass into and become arranged within the dielectric material of the sidewall spacers when subjected to high temperature anneals. The presence of impurity species within the dielectric material would promote the flow of parasitic current through the trench isolation structure during operation of an ensuing integrated circuit employing the isolation structure.

Advantageously, the oxide liner arranged between the low K dielectric spacers and the silicon-based substrate helps inhibit cross-diffusion of atoms between those regions. The oxide liner, being a high quality thermally grown oxide incorporated with nitrogen, contains stoichiometric $SiO_2$ and strong Si—N bonds. While it may be possible for some foreign atoms to migrate into the oxide liner, very few of the foreign atoms are able to pass entirely through the oxide liner. In addition, the fill oxide may be strategically placed above the dielectric spacers to inhibit atoms within the spacers from passing into an overlying interlevel dielectric which has a high propensity for accepting such foreign atoms. Absent the fill oxide, foreign atoms could become positioned within an interlevel dielectric that has a relatively low density, e.g., spin-on-glass (SOG). It is believed that silicon and oxygen atoms within the oxide liner and the fill oxide block the pathways of the foreign atoms, preventing the deleterious diffusion of those atoms into other regions of the semiconductor topography. In this manner, the oxide liner and fill oxide function as good diffusion barriers against migration of species from the low K dielectric spacers of the isolation structure to adjacent regions, and vice versa.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
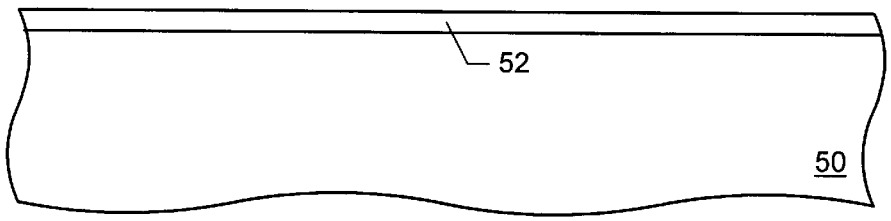
FIG. 1 is a partial cross-sectional view of a semiconductor topography, wherein an oxide layer is formed across a semiconductor substrate, according to an embodiment of the present invention.
Figure 2:
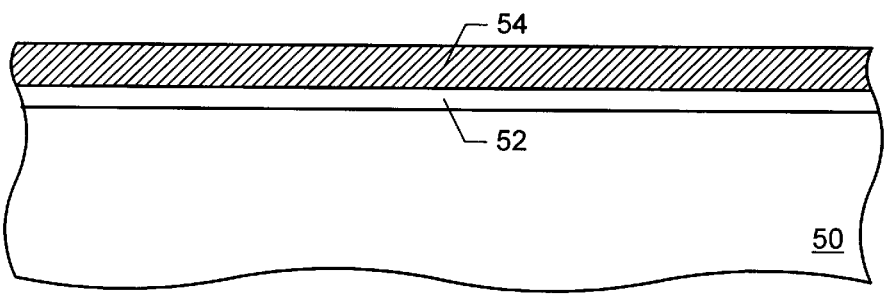
FIG. 2 is a partial cross-sectional view of the semiconductor topography, wherein a silicon nitride layer is deposited across the oxide layer, subsequent to the step in FIG. 1.
Figure 3:
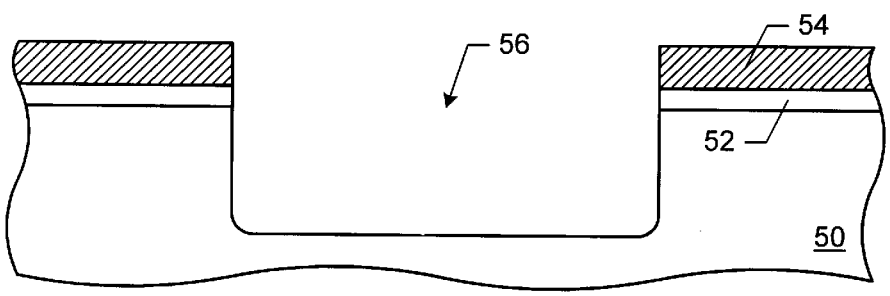
FIG. 3 is a partial cross-sectional view of the semiconductor topography, wherein portions of the silicon nitride layer, the oxide layer, and the substrate are removed to define a trench within the semiconductor substrate, subsequent to the step in FIG. 2.

Turning now to FIG. 1, a partial cross-sectional view of a semiconductor substrate 50 is depicted. Substrate 50 comprises single crystalline silicon slightly doped with n-type or p-type impurities. An oxide layer 52 is formed across semiconductor substrate 50. Oxide layer 52 may either be thermally grown or CVD deposited from, e.g., a silane and oxygen bearing gas upon substrate 50. As shown in FIG. 2, a silicon nitride ("nitride") layer 54 may be deposited across oxide layer 52. The nitride deposition may be performed using, e.g., a horizontal tube LPCVD reactor provided with a silane- and ammonia- containing gas. Oxide layer 52 serves as a "pad oxide" between nitride layer 54 and oxide layer 52 by reducing the inherent stresses that exist between CVD nitride and silicon. FIG. 3 depicts portions of nitride layer 54, oxide layer 52, and substrate 50 being etched down to a level spaced below the upper surface of the substrate. A photoresist layer may be patterned above select portions of masking layer 54 prior to the etch step using a well known optical lithography technique. Those portions of nitride layer 54, oxide layer 52, and substrate 50 not covered by the photoresist layer may be etched for a pre-determined period of time using, e.g., a dry, plasma etch technique. In this manner, a relatively shallow trench 56 having a depth of approximately 0.2 to 1.0 microns is formed within a field region of semiconductor substrate 50.

Figure 4:
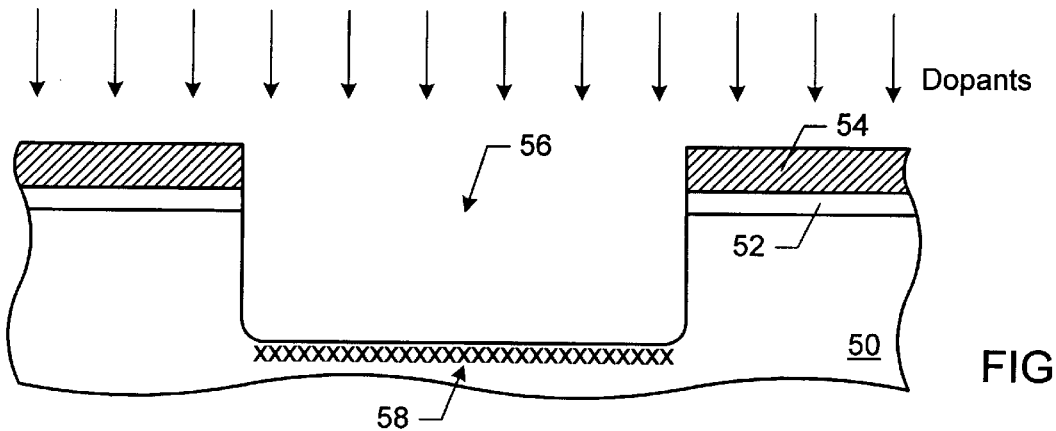
FIG. 4 is a partial cross-sectional view of the semiconductor topography, wherein a channel-stop implant is forwarded into a region of the substrate underlying the trench, subsequent to the step in FIG. 3.
Figure 5A:
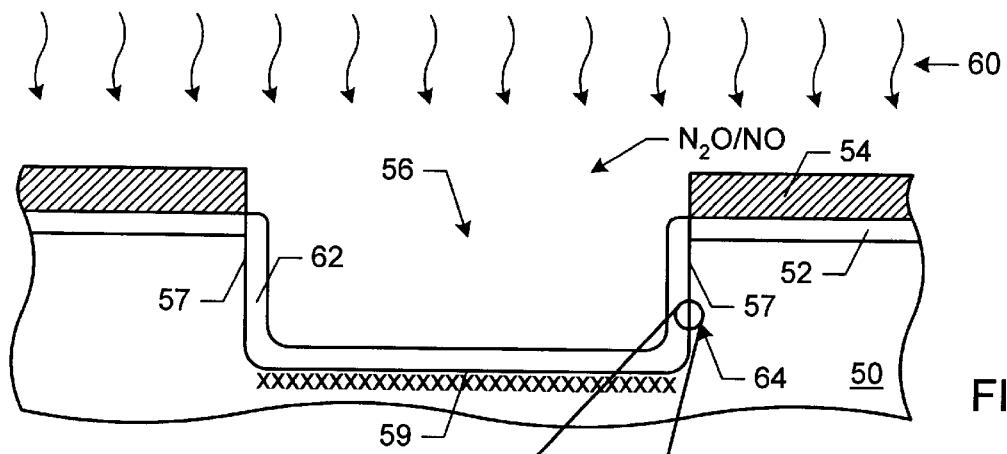
FIG. 5a is a partial cross-sectional view of the semiconductor topography, wherein an oxide liner incorporated with nitrogen is thermally grown upon exposed surfaces of the substrate at the periphery of the trench, subsequent to the step in FIG. 4.
Figure 5B:
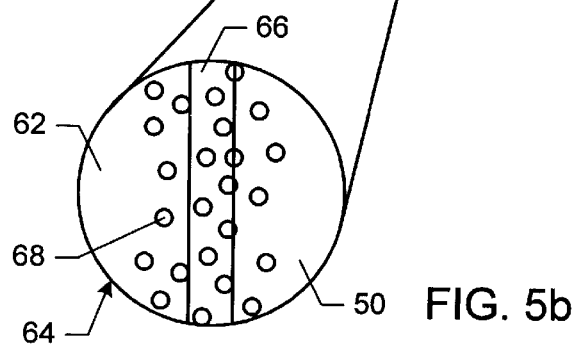
FIG. 5b is a detailed view of FIG. 5a along section 64 of FIG. 5a, wherein nitrogen atoms are arranged near the substrate/oxide liner interface at the periphery of the trench.

FIG. 4 depicts dopants being implanted into a region 58 of substrate 50 directly below trench 56. The nitride layer 54/oxide layer 52 masking structure prevents impurity species from entering underlying regions of substrate 50. As such, only the trench 56 which remains exposed between opposed sidewall surfaces of the nitride layer 54/oxide layer 52 structure, receives the blanket implant. The implant is performed to create a channel-stop dopant layer underneath the ensuing trench isolation structure. The type of dopants chosen for the channel-stop implant is opposite to that used during a later implant into active areas (mesa regions) of substrate 50 which are laterally separated by trench 56. A $p^+$ implant of boron or an nr implant of arsenic, e.g., may be used for the channel-stop implant. As shown in FIG. 5a, the semiconductor topography is then exposed to a form of radiation 60 in the presence of an ambient entrained with nitrogen- and oxygen-containing molecules, e.g., $N_2O$ or NO. In this manner, exposed silicon surfaces of substrate 50 and exposed lateral surfaces of oxide layer 52 are oxidized. Radiation 60 may be thermal radiation provided from a heated furnace. Alternately, radiation 60 may be radiant light supplied from e.g., an arc lamp or a tungsten-halogen lamp using a technique known as rapid thermal processing ("RTP"). RTP allows the semiconductor topography to be heated to a relatively high temperature for a short period of time, and thus reduces or prevents unwanted diffusion of the channel-stop dopants. A thermally grown oxide liner 62 incorporated with nitrogen is thusly formed at the periphery of trench 56 upon the sidewalls 57 and base 59 of the trench. Nitride layer 54 serves to prevent ambient oxygen from reaching those surfaces of substrate 50 arranged underneath oxide layer 52. Therefore, oxidation of the upper surface of substrate 50 is prevented by the presence of nitride layer 54. FIG. 5b illustrates a detailed view along section 64 of FIG. 5a. Oxide liner 62 may have a thickness of, e.g., 50 to 100 Angstroms. During the oxidation process, nitrogen atoms 68 may become arranged in close proximity to the oxide/substrate interface region 66.

Figure 6:
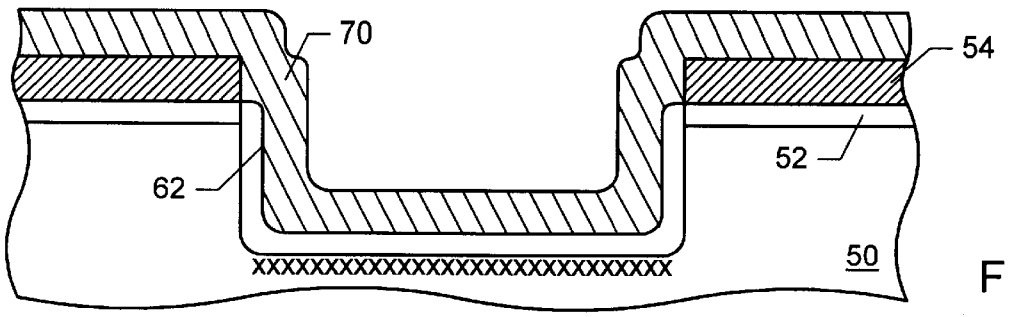
FIG. 6 is a partial cross-sectional view of the semiconductor topography, wherein a layer of dielectric material having a relatively low K value is deposited across exposed surfaces of the topography, subsequent to the step in FIG. 5.
Figure 7A:
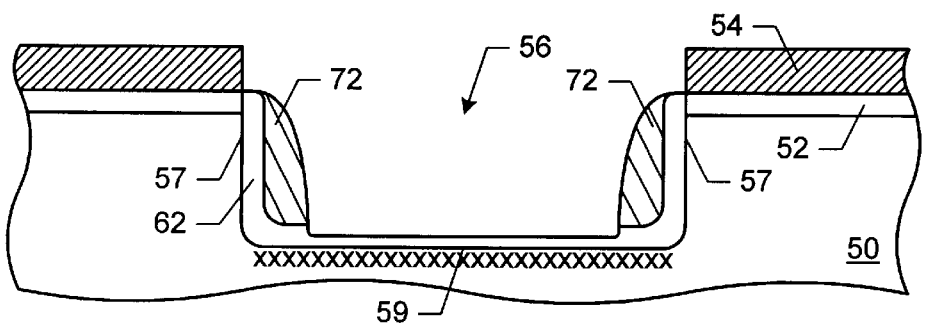
FIG. 7a is a partial cross-sectional view of the semiconductor topography, wherein the dielectric material is anisotropically etched to form sidewall spacers upon lateral surfaces of the oxide liner while a portion of the oxide liner is retained above the base of the trench, subsequent to the step in FIG. 6.
Figure 7B:
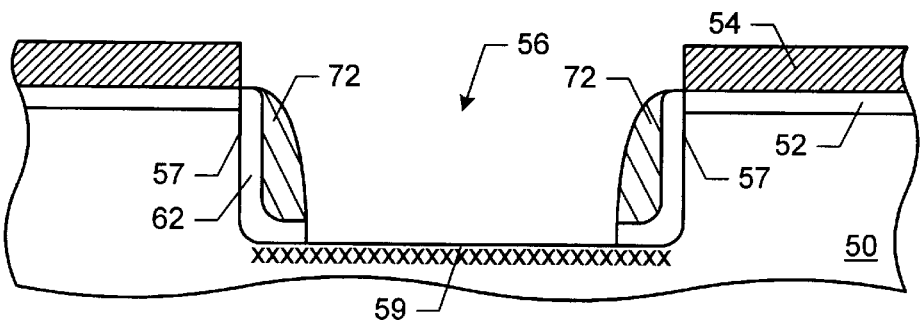
FIG. 7b is a partial cross-sectional view of the semiconductor topography, wherein the dielectric material is anisotropically etched to form sidewall spacers upon lateral surfaces of the oxide liner and the oxide liner is etched from above the base of the trench, subsequent to the step in FIG. 6.

FIG. 6 depicts the deposition of a dielectric material 70 across exposed surfaces of the oxide liner 62 and nitride layer 54. Dielectric material 70 has a dielectric constant, K, that is less than approximately 3.8. The low K dielectric material 70 may be CVD deposited (LPCVD or PECVD) or spin-on deposited across the topological surface. The relatively low K dielectric material 70 may comprise, but is not limited to, the following materials: fluorosilicate glass (FSG), silicon oxyfluoride, hydrogen silsesquioxane, fluorinated polysilicon, poly-phenylquinoxaline, polymer, and fluoro-polymide. Those materials listed above which contain fluorine typically have a K value ranging from approximately 3.0 to 3.8. The polymer-based materials listed above typically have a K value ranging from approximately 2.0 to 3.5. As shown in FIG. 7a, dielectric material 70 may be anisotropically etched to form sidewall spacers 72 upon lateral edges of oxide liner 62. During anisotropic etch, ion ablation of horizontally oriented surfaces occurs more frequently than ion ablation of vertically oriented surfaces. As such, the anisotropic etch may be terminated before a substantial portion of oxide liner 62 is removed from above the base 59 of trench 56. Alternately, as shown in FIG. 7b, the anisotropic etch may be terminated after most of oxide liner 62 has been removed from above the base 59 of trench 56. Retaining oxide liner 62 upon the base 59 of trench 56 is preferred because of the benefits provided by the presence of nitrogen atoms within oxide liner 62. The nitrogen atoms inhibit cross-diffusion of species within substrate 50 and species within the ensuing trench isolation structure.

Figure 8:
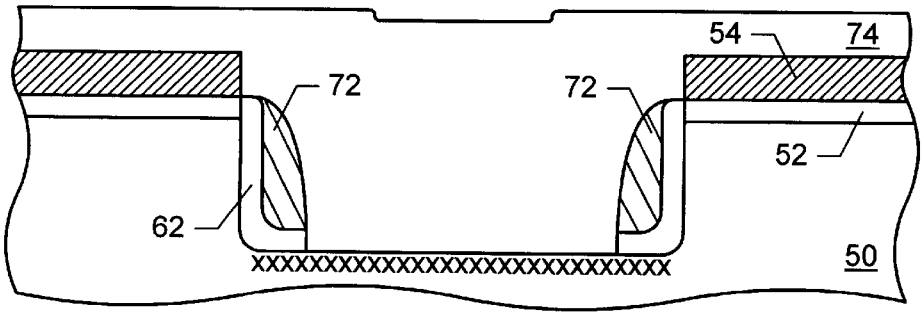
FIG. 8 is a partial cross-sectional view of the semiconductor topography, wherein a fill oxide is deposited across the dielectric material to a level spaced above the masking layer, subsequent to the step in FIG. 7a or 7b.
Figure 9:
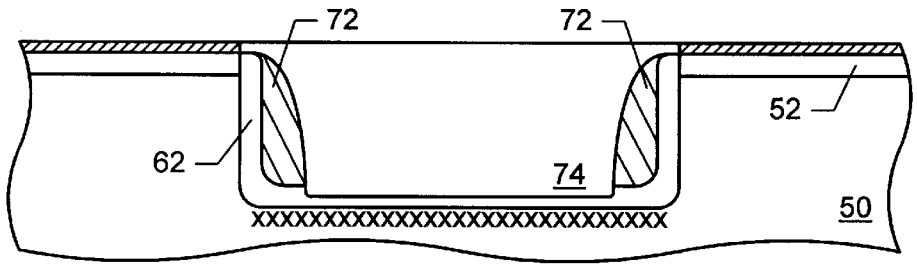
FIG. 9 is a partial cross-sectional view of the semiconductor topography, wherein portions of the fill oxide and the nitride layer are removed down to a level spaced above the sidewall spacers using CMP, subsequent to the step in FIG. 8.
Figure 10:
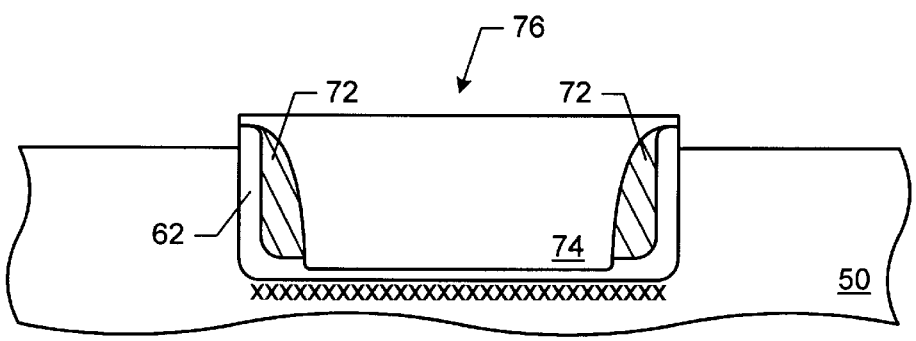
FIG. 10 is a partial cross-sectional view of the semiconductor topography, wherein the oxide layer and the nitride layer are etched from above the semiconductor substrate to form a trench isolation structure, subsequent to the step in FIG. 9.

Turning to FIG. 8, a fill oxide 74 may then be CVD deposited from, e.g., a tetraethyl orthosilicate (TEOS) source across exposed surfaces of the semiconductor topography to a level spaced above the upper surface of masking layer 54. As shown in FIG. 9, CMP may be used to simultaneously planarize the upper surface of the semiconductor topography and remove that upper surface down to a level spaced above the surface of substrate 50. Preferably, the upper surface of the fill oxide 74 is slightly displaced above the peaks of low K dielectric sidewall spacers 72. As depicted in FIG. 10, the oxide layer 52 and the remaining portions of nitride layer 54 may be removed from above the upper surface of silicon-based substrate 50 using optical lithography and an isotropic etch chemistry which exhibits high selectivity to nitride and oxide in relation to silicon. The resulting trench isolation structure 76 includes sidewall spacers 72 which have a relatively low dielectric constant. Sidewall spacers 72 are isolated from other regions of the ensuing integrated circuit by oxide liner 62 and fill oxide 74. The presence of the low K dielectric sidewall spacers 72 within trench isolation structure 76 reduces the possibility of current inadvertently flowing between active areas separated by the isolation structure.

Figure 11A:
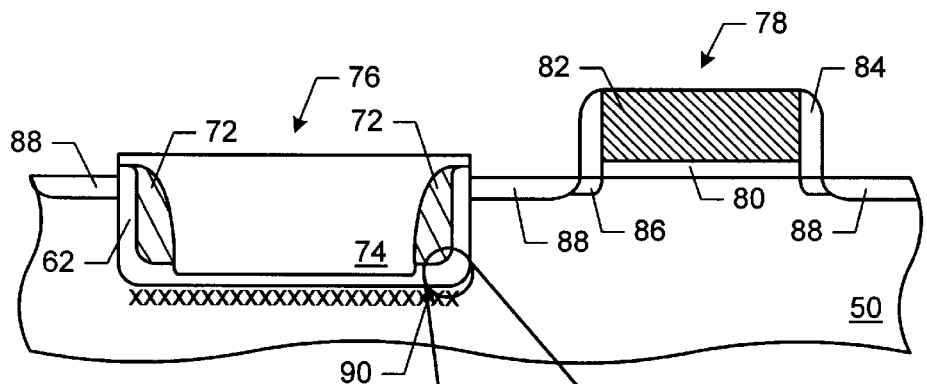
FIG. 11a is a partial cross-sectional view of the semiconductor topography, wherein a transistor is placed laterally adjacent the trench isolation structure formed in FIG. 10.
Figure 11B:
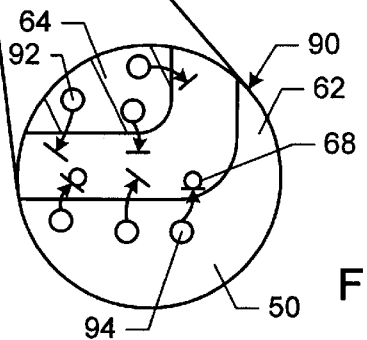
FIG. 11b is a detailed view along section 90 of FIG. 11a, wherein the oxide liner incorporated with nitrogen atoms inhibits cross-diffusion of atoms between the sidewall spacers and the semiconductor substrate.

FIGS. 11a depicts the semiconductor topography shown in FIG. 10 after active devices, such as transistor 78 have been formed within and upon substrate 50. Transistor 72 includes a gate conductor 82 comprising doped polycrystalline silicon which is spaced above substrate 50 by a gate dielectric 80. Dielectric sidewall spacers 84 are arranged upon the opposed sidewall surfaces of gate conductor 82. Lightly doped drain ("LDD") areas 86 which contain a relatively light concentration of dopants are arranged within substrate 50 directly underneath sidewall spacers 84. Heavily doped source/drain regions 88 are arranged laterally adjacent LDD areas 86. Source/drain regions 88 of different active devices are isolated from each other by trench isolation structure 76. FIG. 11b depicts a detailed view along section 90 of FIG. 11a. Oxide liner 62 which is incorporated with nitrogen serves as a diffusion barrier which prevents cross-diffusion of atoms between low K dielectric sidewall spacers 72 and substrate 50. As described previously, sidewall spacers 72 may be composed of a material comprising atoms 92, such as F, H, and/or C which could contaminate source/drain regions 88. Further, impurities within substrate 50, such as atoms 94 could deleteriously affect the operability of the ensuing integrated circuit if they pass into trench isolation structure 76. Oxide liner 62 advantageously blocks the migration avenues of atoms 92 and atoms 94 through the oxide liner to other regions of the semiconductor topography. For example, nitrogen atoms 68 positioned within oxide liner 62 in close proximity to the periphery of the trench isolation structure 76 may block the pathways of foreign atoms 94, thereby preventing the foreign atoms 94 from passing into trench isolation structure 76.

It will be appreciated to those skilled in the art having the benefit of this disclosure that this invention is believed to provide a method for forming a trench isolation structure which includes dielectric sidewall spacers having a relatively low dielectric constant arranged upon an oxide liner incorporated with nitrogen. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:

etching a trench within a semiconductor substrate;

forming a dielectric liner having barrier atoms upon sidewall surfaces of the trench;

depositing a dielectric material having a dielectric constant less than approximately 3.8 upon the dielectric liner; and removing the dielectric material except in regions adjacent the dielectric-covered sidewall surfaces of the trench to form sidewall spacers.

2. The method of claim 1, wherein said forming the dielectric liner comprises subjecting said semiconductor substrate to thermal radiation while said substrate is exposed to an ambient comprising an oxygen-containing molecule and a nitrogen-containing molecule.

3. The method of claim 1, wherein said dielectric liner comprises silicon dioxide, and wherein said barrier atoms comprise nitrogen atoms arranged in close proximity to a periphery of said isolation trench.

4. The method of claim 1, further comprising:

forming a masking layer above said semiconductor substrate; and etching select portions of said masking layer and said substrate prior to said forming the dielectric liner, thereby forming said trench within said substrate contiguous with an opening which extends through said masking layer.

5. The method of claim 4, wherein said masking layer comprises a nitride layer arranged across a pad oxide layer.

6. The method of claim 4, wherein said removing comprises anisotropically etching said dielectric material, thereby removing said dielectric material from a majority of horizontally oriented surfaces.

7. The method of claim 6, wherein said dielectric liner is formed upon a base of said isolation trench concurrent with being formed upon said sidewall surfaces of said isolation trench.

8. The method of claim 7, wherein at least a portion of said dielectric liner arranged upon said base of the isolation trench is etched concurrent with said anisotropically etching the dielectric material.

9. The method of claim 4, further comprising:

depositing a fill oxide from a tetraethyl orthosilicate source across said sidewall spacers and said masking layer to a first level spaced above said masking layer;

removing an upper surface of said fill oxide down to a second level spaced above an apex of said sidewall spacers, wherein said second level is arranged a spaced distance below said first level; and etching said masking layer from above said semiconductor substrate.

10. The method of claim 1, wherein said dielectric material comprises a material selected from the group consisting of fluorosilicate glass, hydrogen silsesquioxane, fluorinated polysilicon, poly-phenylquinoxaline, polyquinoline, methys silses quoxone polymer, and fluoro-polymide.

11. The method of claim 4, further comprising implanting channel-stop dopants into a region of said semiconductor substrate directly underneath said trench subsequent to forming said trench.

12. The method of claim 1, wherein said dielectric liner serves as a diffusion barrier against cross-diffusion of atoms within said dielectric material and impurity species within said semiconductor substrate.

* * * * *